US 6,749,824 B2

(12) United States Patent
Keck et al.

(10) Patent No.: US 6,749,824 B2
(45) Date of Patent: Jun. 15, 2004

(54) CHEMICAL VAPOR DEPOSITION SYSTEM FOR POLYCRYSTALLINE SILICON ROD PRODUCTION

(75) Inventors: David W. Keck, Butte, MT (US); Ronald O. Russell, Anaconda, MT (US); Howard J. Dawson, Anacortes, WA (US)

(73) Assignee: Advanced Silicon Materials LLC, Silver Bow, MT (US)

( * ) Notice: Subject to any disclaimer, the term of this patent is extended or adjusted under 35 U.S.C. 154(b) by 0 days.

(21) Appl. No.: 10/367,365

(22) Filed: Feb. 13, 2003

(65) Prior Publication Data

US 2003/0127045 A1 Jul. 10, 2003

Related U.S. Application Data

(60) Division of application No. 09/842,276, filed on Apr. 24, 2001, now Pat. No. 6,544,333, which is a continuation-in-part of application No. 09/212,088, filed on Dec. 15, 1998, now Pat. No. 6,221,155.
(60) Provisional application No. 60/069,596, filed on Dec. 15, 1997.

(51) Int. Cl.[7] .......................... C01B 33/02; C30B 29/06
(52) U.S. Cl. ...................... 423/348; 423/349; 423/350; 117/2; 117/3
(58) Field of Search .................. 423/348, 349, 423/350; 117/2, 3

(56) References Cited

U.S. PATENT DOCUMENTS

| | | |
|---|---|---|
| 3,023,087 A | 2/1962 | Enk et al. |
| 3,523,816 A | 8/1970 | Cave et al. |
| 3,938,031 A | 2/1976 | Blackmond |
| 4,147,814 A | 4/1979 | Yatsurugi et al. |
| 4,150,168 A | 4/1979 | Yatsurugi et al. |
| 4,215,154 A | 7/1980 | Behensky et al. |
| 4,292,344 A | 9/1981 | McHale |
| 4,331,698 A | 5/1982 | Behensky et al. |
| 4,506,131 A | 3/1985 | Boehm et al. |
| 4,578,552 A | 3/1986 | Mortimer |
| 4,579,080 A | 4/1986 | Martin et al. |
| 4,724,160 A | 2/1988 | Arvidson et al. |
| 4,734,297 A | 3/1988 | Jacubert et al. |
| 4,805,556 A | 2/1989 | Hagan et al. |
| 4,900,411 A | 2/1990 | Poong et al. |
| 4,921,026 A | 5/1990 | Flagella et al. |
| 4,957,777 A | 9/1990 | Ilderem et al. |
| 5,000,113 A | 3/1991 | Wang et al. |
| 5,179,677 A | 1/1993 | Anderson et al. |
| 5,260,538 A | 11/1993 | Clary et al. |
| 5,433,786 A | 7/1995 | Hu et al. |
| 5,478,396 A | 12/1995 | Keck et al. |
| 5,499,598 A | 3/1996 | Oda |
| 5,536,918 A | 7/1996 | Ohkase et al. |
| 5,540,781 A | 7/1996 | Yamagami et al. |
| 5,545,387 A | 8/1996 | Keck et al. |
| 5,550,354 A | 8/1996 | Kimura et al. |
| 5,553,109 A | 9/1996 | Matzner |
| 5,603,772 A | 2/1997 | Ide |
| 5,976,481 A * | 11/1999 | Kubota et al. .............. 423/348 |
| 6,057,243 A | 5/2000 | Nagayama |
| 6,110,274 A | 8/2000 | Okuno |
| 6,166,322 A * | 12/2000 | Chen et al. ................. 136/251 |
| 6,221,155 B1 | 4/2001 | Keck et al. |

FOREIGN PATENT DOCUMENTS

WO    WO 97/36822    10/1997

OTHER PUBLICATIONS

Fowle et al., *Standard Handbook For Electrical Engineers*, New York and London, Sec. 19 (1933), pp. 186–197.

* cited by examiner

Primary Examiner—Felisa Hiteshew
(74) Attorney, Agent, or Firm—Klarquist Sparkman LLP

(57) ABSTRACT

Disclosed are processes and reactor apparatus for rapidly producing large diameter, high-purity polycrystalline silicon rods for semiconductor applications. A.C. current, having a fixed or variable high frequency in the range of about 2 kHz to 800 kHz, is provided to concentrate at least 70% of the current in an annular region that is the outer 15% of a growing rod due to the "skin effect."

3 Claims, 3 Drawing Sheets

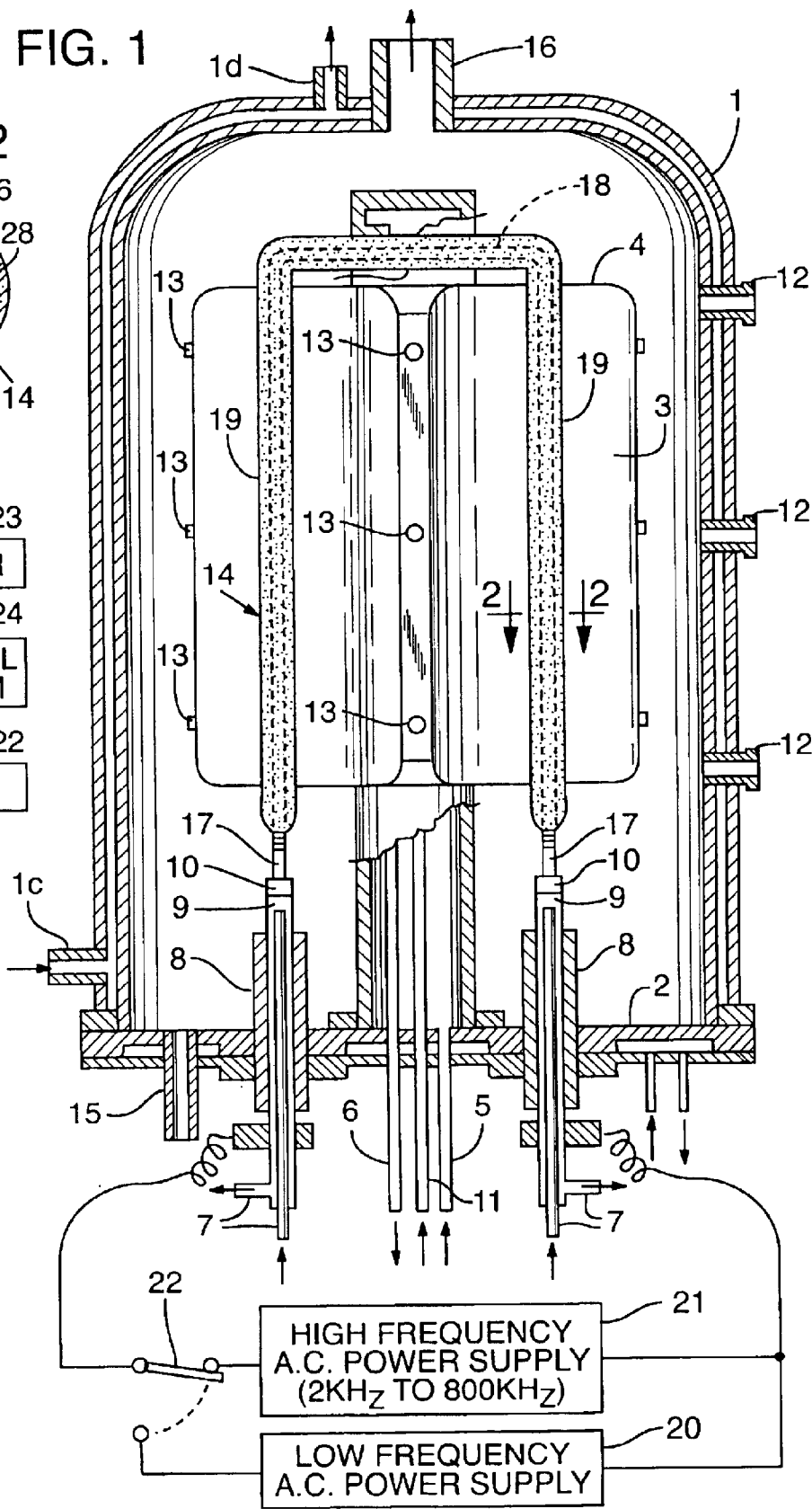

TEMPERATURE PROFILE OF A 150 MM DIAMETER POLY SILICON ROD

RADIAL STRESS PROFILE OF A 150 MM DIAMETER POLY SILICON ROD

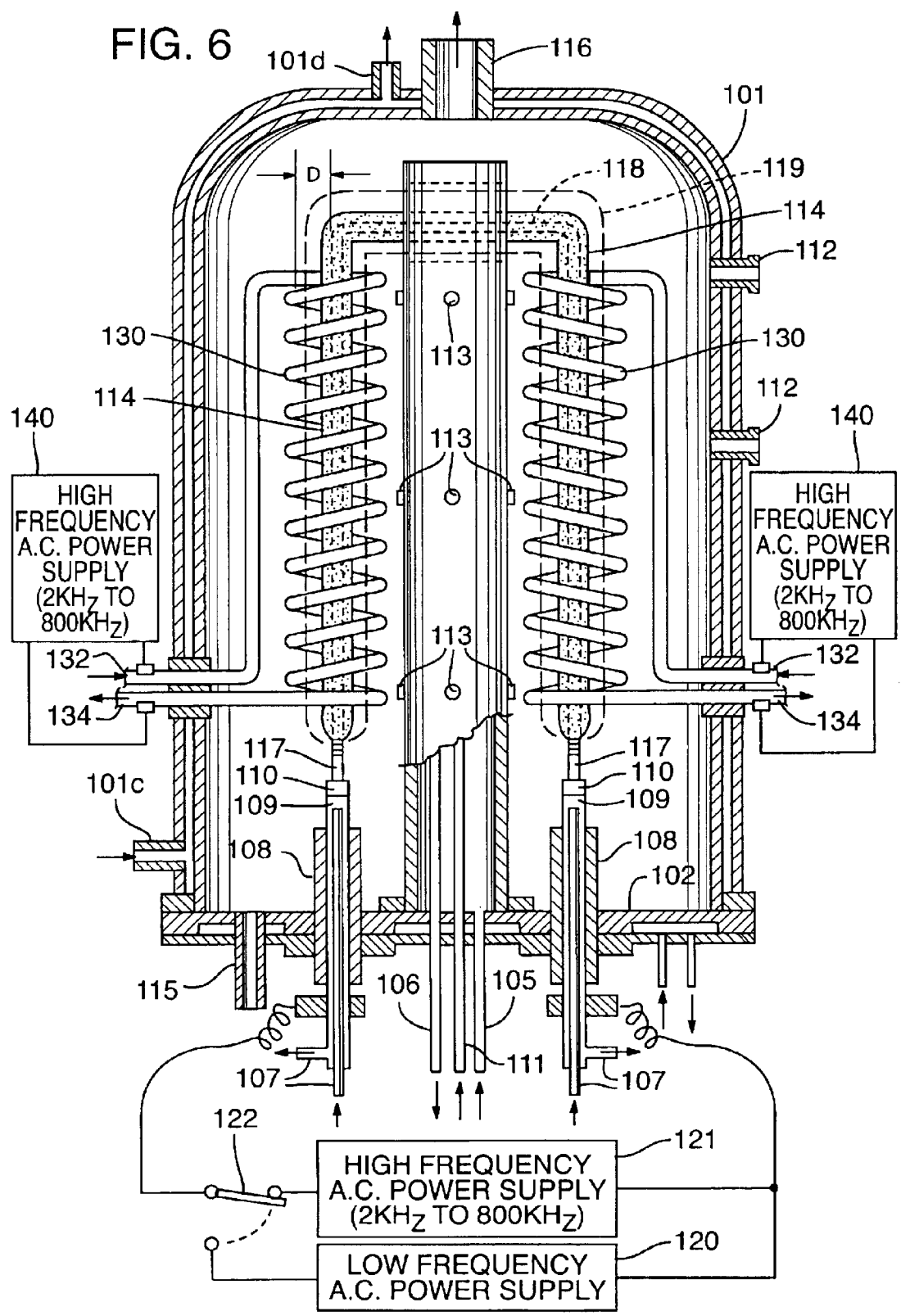

CHEMICAL VAPOR DEPOSITION SYSTEM FOR POLYCRYSTALLINE SILICON ROD PRODUCTION

This is a division of application Ser. No. 09/842,276, filed, Apr. 24, 2001, now U.S. Pat. No. 6,544,333, which is a continuation-in-part of application Ser. No. 09/212,088, filed, Dec. 15, 1998, now U.S. Pat. No. 6,221,155, which claims the benefit of U.S. Provisional Application No. 60/069,596, filed Dec. 15, 1997, which prior applications are incorporated herein by reference.

BACKGROUND

The present invention relates to a process and equipment for the production of high-purity polycrystalline silicon in rod form for semiconductor applications. The polycrystalline silicon is used as the raw material in the fabrication of single crystal silicon for semiconductors by the CZ (Czochralski) method or the FZ (float zone) method.

The most common method of producing polycrystalline silicon, which is a raw material used for the production of single crystal silicon for semiconductors, has been to deposit silicon on starter filaments by thermal decomposition of a chloride-type silane, such as trichlorosilane, so as to produce silicon rods. Such a process is described in U.S. Pat. No. 4,724,160 of Arvidson et al. Japanese Patent Laid-Open No. 56-105622 discloses a reactor structure using a chloride-type silane in which a large number of electrodes are arranged on a circular plate and a large number of silicon starter filaments are arranged in an inverted U-shaped or a square inverted U-shaped form.

Another method involves the production of polycrystalline silicon from monosilane gas, which is another common starting material. Silicon starter filaments are heated inside the reactor. At a temperature of several hundred degrees or more, monosilane gas decomposes and deposits on heated filaments to form larger-diameter silicon rods. The rods may be thermally insulated from each other so as to prevent vapor-phase temperature rise and as to eliminate thermal influences from the adjacent heated silicon rods, thereby obtaining uniform silicon deposition.

Polycrystalline silicon, in the form of rods or chunks obtained by crushing rods, is being widely used in the production of single crystal silicon by the CZ or FZ method. A high purity level and competitive cost are particularly required of polycrystalline silicon rods for semiconductor applications.

In both of the silicon deposition systems described above, a power supply is used to pass current through the rods for such heating of the rods. The existing power supplies for the thermal decomposition furnaces, such as that shown in U.S. Pat. Nos. 4,147,814 and 4,150,168 of Yatsurugi et al., and U.S. Pat. No. 4,805,556 of Hagan et al., and U.S. Pat. No. 5,478,396 of Keck et al., produce up to 2000 amps of current at 60 Hz power supplied at this low 60 Hz frequency (or the European standard power frequency of 50 Hz), allows the heating current to flow throughout the rod's cross-section during thermal decomposition.

When power is supplied at 60 Hz, the current migrates toward the centers of the rods. The center of a rod becomes progressively hotter, relative to the surrounding outer region of the rod, since the center is thermally insulated by the outer region or "skin" of the rod. Heating at the center causes electrical resistance to decrease at the center, since $r=f(1/T)$. The lower resistance causes even more current to flow through the center, which creates more heat.

Since a majority of the current flows through the center of the rod when operating at 60 Hz, the center of a rod becomes considerably hotter than the skin portion of the rod. This uneven temperature profile in turn creates internal thermal stresses when the rods cool down following growth, with the resulting rods being brittle and subject to breakage. In particular, when the power is turned off, the surface of the rod cools and contracts quickly to a given depth. The cooled surface acts as an insulative layer to the rod interior. Because of the insulative effect, the center of the rod cools at a much slower rate. This has the effect of radially pulling the surface into a compression state while the inner part of the rod is in a state of tension due to the smaller specific volume. It is easy to picture that, as the radius approaches zero, the stresses increase due to cooling rates that are progressively slower as one approaches the center of the rod. Due to the stresses, to obtain commercially acceptable yields, rods produced with 60 Hz power supplies have been limited to a maximum diameter of about 150 mm.

SUMMARY

Improved processes and equipment have been developed for the production of polycrystalline silicon in rod form for semiconductor applications by thermal decomposition of a highly refined silane or halosilane gas and deposition of silicon on a deposition surface. Using such processes and equipment, it is possible to produce a rod as large as 300 mm or more in diameter having a stress of no more than 11 megapascals (MPa) throughout the volume of the rod.

Such low stress rods can be formed by maintaining the entire volume of a silicon rod within a 50° C. temperature range during a majority of the time period during which silicon is deposited on the deposition surface. When this is done, the strength of polycrystalline silicon rods is increased so that rods having diameters of as much as 300 mm or more can be grown reliably.

A high frequency power supply, that can produce current of a frequency in the range of 2 kHz to 800 kHz, can be used to maintain the entire volume of a silicon rod within the 50° C. temperature range during the deposition of silicon. Such a high frequency power source will concentrate the current on the surface of a growing rod due to the "skin effect" and thereby more uniformly heat the rod and decrease rod brittleness.

BRIEF DESCRIPTION OF THE DRAWINGS

In the drawings:

FIG. 1 is a schematic vertical sectional view showing a first reactor for the production of high-purity polycrystalline silicon rods for semiconductor applications by the deposition of silicon from a silicon-bearing gas.

FIG. 2 is a sectional view taken along line 2—2 of FIG. 1 showing the cross section of a rod after it has been grown to a diameter greater than 150 mm.

FIG. 3 is a diagram of a control circuit for operation of a power supply of the type shown in FIG. 1.

FIG. 6 is a schematic vertical sectional view showing a second reactor for the production of high-purity polycrystalline silicon rods for semiconductor applications by the deposition of silicon from a silicon-bearing gas.

DETAILED DESCRIPTION

Figure 4:
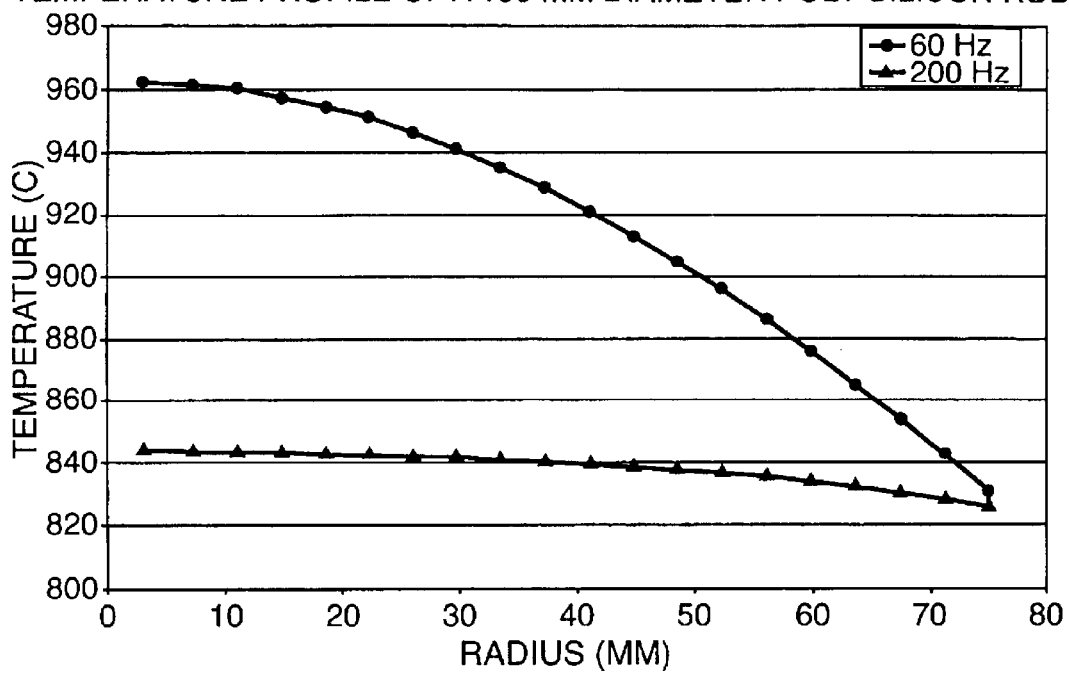
FIG. 4 is a chart showing calculated temperature profiles for 150 mm diameter silicon rods heated by A.C. current.

FIG. 1 shows chemical vapor deposition (CVD) equipment for the production of high-purity polycrystalline silicon for semiconductor applications. In such a reactor, monosilane gas is decomposed and silicon is deposited at heated deposition surfaces of growing silicon rods. The illustrated reactor is similar to that disclosed in the above-mentioned U.S. Pat. No. 4,150,168, which is hereby incorporated herein by reference. A cover or bell 1 and a round base plate 2 provide a reactor vessel. A partition member 4, that is a heat exchanger or water jacket having a cooling water inlet pipe 5 and outlet pipe 6 and that is shaped to define multiple reaction chambers 3, is provided inside a cylindrical space defined by the cover 1 and base plate 2.

The cover 1 is least partially hollow and serves as a water cooled heat exchanger or cooling jacket. The lower surface of the cover 1 serves as the reactor vessel ceiling. Provided in the cover section are a cooling water inlet 1c and a cooling water outlet 1d. As cooling water moves from the inlet 1c to the outlet 1d, it flows through the space between the inner and outer walls of the cover. Electrodes 9 extend from below through the base plate 2, through the intermediation of insulating members 8, and are arranged at positions corresponding to the centers of the reaction chambers 3. The insulating members 8 are preferably formed of a ceramic material. Chucks 10 are attached to the tips of the electrodes 9 that are water cooled through inlet and outlet cooling pipes 7. The water flowing through the water cooling jacket may be replaced by another cooling fluid or a heating medium.

A reactant gas delivery pipe 11 extends upwardly from below through the base plate 2 and connects a plurality of gas nozzles 13 that are spaced to distribute monosilane gas along the reaction chambers 3. Provided inside each of the gas nozzles 13 is a capillary or an orifice to enable the monosilane gas to be ejected uniformly through the nozzles 13. An exhaust pipe 16 is used to remove spent reactant gas. Viewing windows 12 may be provided through the cover 1 and its cooling jacket to enable observation of the rods 14 during the deposition process. One or more sensors 23, such as pyrometers (not shown), may be used to monitor the surface temperature of rods growing in the reactor.

One or more power supplies are connected to the electrodes 9 to pass current through the rods 14 for heating rods. The system shown in FIG. 1 includes a low frequency power supply 20, a high frequency power supply 21, and a switch 22 suitable to connect one or the other of the power supplies 20, 21 to the electrodes 9. The low frequency power supply 20 supplies current at a relatively low frequency, such as the 60 Hz standard frequency (or the European standard power frequency of 50 Hz). The high frequency power supply 21 is capable of operating in the 2 kHz to 800 kHz range with an A.C. current amplitude in the range of 10 to 3000 amperes and a voltage amplitude in the range of 200 to 30,000 volts. Most advantageously, the high frequency power supply is of the type wherein the current can be varied through a range of frequencies. Conveniently, the power supplies 20, 21 could be combined in a single, variable current power supply (not shown) that has integral switching circuitry and is capable of operating at both low and high frequencies.

Silicon initial rods or starter filaments 17 are positioned in the reaction chambers 3 and held at their lower ends by the chucks 10. Two silicon starter filaments 17 are connected to each other at their upper ends through a silicon bridge 18 to provide an inverted U-shaped filament on which a silicon rod 14 is formed. Cooling water is circulated through the cover 1.

Because silicon is not very electrically conductive at ambient temperature, the silicon starter filaments 17 may be preheated to a desired temperature, typically at least 200° C., to increase their conductivity. The surfaces of the preheated filaments then can be maintained at an elevated temperature by supplying electricity to the filaments through the electrodes 9 so the surfaces can serve as silicon deposition surfaces. Preheating can be accomplished by supplying a blast of hot inert gas through inlet 15 in the base plate 2 as described in U.S. Pat. No. 4,150,168, of Yatsurugi. Preheating can also be accomplished by operation of a radiant heat source (not shown) inside the reactor.

The filaments also may be preheated by directly supplying low frequency A.C. current thereto through the electrodes 9, as described in U.S. Pat. No. 4,150,168, but at a high voltage. For example, filaments may be heated by applying a voltage as high as 30,000 volts at a frequency of 60 Hz. After the silicon heats up beyond a temperature of 200° C., its resistance decreases with increasing temperature, so it has "broken into conduction." At that point, the voltage can be decreased to about 3,000 volts and the 60 Hz current regulated to provide a desired silicon deposition surface temperature in the range of 600° C. to 1200° C. A silane gas, most advantageously monosilane gas, is fed into the reactor through the gas pipe 11 and the gas nozzles 13. While ascending inside the reaction chambers 3 that are heated by the silicon starter filaments 17, the gas reacts to deposit polycrystalline silicon 19 on the surfaces of the silicon starter filaments 17. The deposited silicon builds up to form polycrystalline silicon rods 14. Each starter filament 17 thus provides an initial silicon deposition surface, and after silicon is deposited on the filament, the outer surface of the deposited silicon serves as the deposition surface.

With monosilane gas, best results are obtained when the deposition surface of a growing rod is maintained at a temperature of about 850° C. during deposition of silicon on the rods. Reactant gas that has been blown upwards beyond the reaction chambers 3 is removed through the exhaust pipe 16. While the growing silicon rods are small, the current can be as low as 20 amps. As the rods increase in diameter, the current necessary to keep the silicon deposition surface at a constant temperature steadily increases while the required voltage decreases.

At some point, determined by the measurement of one or more parameters such as elapsed time, current consumption, a product attribute such as rod diameter, surface temperature or the like, the 60 Hz current is turned off, for example by automated operation of the switch 22, and the rods are further maintained at a desired temperature by high frequency current supplied by the high frequency power source 21. For example, as illustrated in FIG. 3, a sensor or timer 23 signals a control system 24, preferably a computer control system, when a triggering event has occurred. The control system 24 then operates the switch 22, e.g. by operation of a solenoid, to engage the high frequency power supply 21. Because the high frequency power supply 21 provides alternating current in the 2 kilohertz to 800 kilohertz range, heating current migrates to the surface of a rod because of the "skin effect." To take best advantage of the skin effect, the high frequency power supply should be configured to deliver current such that at least about 70% of the current is concentrated in an annular outer region 26 shown in FIG. 2, which outer region is the outer 15% of the radius of a rod being grown in a reactor. A lesser amount of current flows through a core or inner region 28 of the rod located inside the outer region 26. In general, it is desirable to keep the high frequency current frequency as low as possible, within the 2 kilohertz to 800 kilohertz range, to minimize inductive losses and so that equipment can be built using solid state components, which are frequency limited.

It may also be advantageous to vary the frequency during the CVD process to further minimize the internal stresses within the rods. Optimal frequencies can be determined experimentally.

Best results are achieved when the frequency or current amplitude of the high frequency current provided by the high frequency power supply 21 is regulated such that the temperature of the entire volume of the silicon body is maintained within a 50° C. temperature range during at least a majority of the period of time when silicon is being deposited. Ideally, the temperature will be maintained within the 50° C. temperature range during the entire silicon deposition process, but in commercial operation, it may not be practical to maintain the entire volume of a rod within this temperature range during the entire deposition process, such as during the early stages of deposition after preheating. Uniform temperature operation should be established as soon as practical and thereafter maintained during the remainder of the growth process until rods of a desired diameter for produced. At that point, the power supply 21 is de-energized and the rods allowed to cool. It is believed that polysilicon rods of up to 300 mm or more in diameter can be produced in this manner. Such rods should have a stress of no more than 11 MPa throughout their entire volumes.

The following calculations are the approximate depths of current flow from the outer surface of the rods 14 due to the skin effect with a power supply at frequencies of 60 Hz, 2 kHz, 20 kHz, 200 kHz, and 800 kHz. Note that these skin depths are independent of the effects discussed above. The formula to determine skin depth is $$\delta = \frac{1}{\sqrt[2]{\pi f \mu \sigma}}$$

in which δ is the skin depth in meters, $f$ the frequency in hertz, $\mu$ is the magnetic permeability, and $\sigma$ is the conductivity. The term $\mu$ is $\mu = \mu_o^* \mu_r$, where $\mu_o$, is the permeability of free space ($4\pi*10^{-7}$ H/m), and $\mu_r$ is a scaling term for the conductor. For silicon, $\mu_r$ (relative permeability) is very nearly 1. The resistivity ρ of silicon at 815° C. was found to be 0.03 Ω*cm. Since conductivity σ=1/ρ, a value of 3333 siemens/meter was used for conductivity.

$$\delta(f = 60) = \frac{1}{\sqrt[2]{60*\pi*\mu*333}} = 1125 \text{ mm} = 44.29 \text{ inches}$$

$$\delta(f = 2*10^3) = \frac{1}{\sqrt[2]{2*10^3*\pi*\mu*333}} = 195 \text{ mm} = 7.68 \text{ inches}$$

$$\delta(f = 20*10^3) = \frac{1}{\sqrt[2]{20*10^3*\pi*\mu*333}} = 61.64 \text{ mm} = 2.427 \text{ inches}$$

$$\delta(f = 80*10^3) = \frac{1}{\sqrt[2]{80*10^3*\pi*\mu*333}} = 91.95 \text{ mm} = 3.767 \text{ inches}$$

The skin depth value δ is the depth from the surface of the rod of 67% of the current. The current falls off exponentially from the outer surface toward the center of the conductor. These calculations show that at a frequency of 60 Hz, the current will not be affected by the skin effect in 150 mm rods. At a frequency of 200 kHz, 67% of the current will run in the outer 19.5 mm of the radius and at a frequency of 800 kHz, 67% of the current will flow in the outer 9.75 mm of radius. It should be noted that the temperature of the rods can be adjusted by varying the current amplitude or the frequency of the power supply.

As an example, silicon rods 150 mm in diameter can be grown in a reactor of the type shown in FIG. 1. Silicon starter filaments 17 will be preheated by initially supplying a low frequency current at a voltage of 26,000 volts and a frequency of 60 Hz to the filaments. After the silicon heats up beyond a temperature of 200° C., the voltage is decreased to about 1,700 volts and the low frequency current is adjusted, as needed, to provide a desired silicon deposition surface temperature of about 825° C. Monosilane gas, is fed into the reactor through the gas nozzles 13 and the gas reacts to deposit polycrystalline silicon 19 on the surfaces of the silicon starter filaments 17. The deposited silicon builds up to form polycrystalline silicon rods 14. Initially the current is 25 amps. As the rods increase in diameter, the current is steadily increased and the voltage is decreased to keep the silicon deposition surface at a constant temperature of about 825° C. At a rod diameter of about 50 mm, at which point the current is about 300 amps at a voltage of about 800 volts, a sensor 23 signals the computer control system 24 to operate the switch 22. The switch turns off the low frequency power supply 20 and connects the high frequency power supply 21, which provides high frequency current, at about 200 kilohertz, sufficient to maintain the surfaces of the rods at about 825° C.

Figure 5:
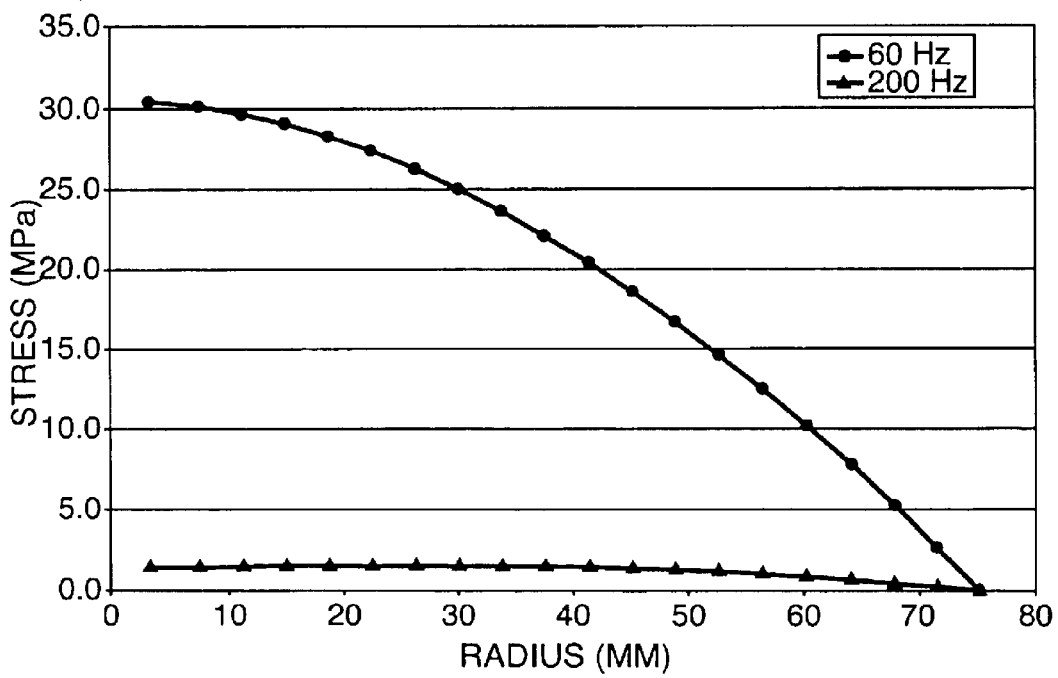
FIG. 5 is a chart showing calculated radial stress profiles for 150 mm diameter silicon rods produced by heating with A.C. current.

When operating at this high frequency, heating current migrates to the surface of a rod because of the "skin effect." The high frequency power supply delivers current at a frequency such that at least about 70% of the current is concentrated in the outer 15% of the rods. As silicon continues to deposit on the deposition surfaces of the growing rods, the electrical current and voltage are adjusted, as needed, such that the temperature of the entire volume of the silicon body is maintained within a 50° C. temperature range during substantially the entire period of growth of the rod beyond 50 mm. The amperage and voltage are varied, as the diameters of the rods increase to 150 mm, to an ending current of about 1500 amps at a voltage of 400 volts. When the rods reach a size of 150 mm in diameter, the power supply 21 is de-energized and the rods allowed to cool. FIG. 4 illustrates the narrow temperature range possible for a 150 mm rod when current is applied at 200 kHz. It is calculated that such rods will have a stress that is not greater than 6 MPa throughout the entire volume of the rods, as shown in FIG. 5.

Such uses of a high frequency power supply in the range of 2 kHz to 800 kHz result in great improvements in rods produced by CVD. It is expected that the rods, up to 300 mm in diameter, made using high frequency heating as described herein will have a stress of no more than 11 MPa throughout their entire volume. Such rods will be sufficiently stress-free that failure due to the stress produced by external heating will be reduced and likely eliminated altogether. It should be possible to grow rods having a diameter of 300 mm or more. The rod diameter limit will not be based on brittleness, but instead on such things as maximum current available, reactor geometry, electrode load and current capability, reactor cooling, and the like.

FIG. 6 illustrates another reactor useful for drawing high-purity polycrystalline silicon rods for the type described herein. In FIG. 6, elements in common to those shown in FIG. 1 are indicated by the same reference numerals incremented by 100. No partitions are shown in FIG. 6. But cooled partitions advantageously may be used to isolate growing rods when the deposited silicon is supplied from certain silicon-bearing gasses, such as monosilane.

A reactor 101 as shown in FIG. 6 differs from the reactor 1 of FIG. 1 in that it includes additional apparatus for generating an electrical current in the outer skin portion of each silicon rod 114 to heat the outer skin portions of the growing silicon rods 114. Specifically, the reactor 101 includes an electrically conductive structure that surrounds each growing rod 114. The structure is positioned sufficiently close to a growing silicon rod 114 that AC current can be induced in the outer skin of the rod by an electrical field generated by applying an AC current to the structure. The structure should also be sufficiently spaced apart from the rod to prevent a short circuit or mechanical interference as the rod grows to its full size (as indicated by the dashed line profile 119).

In the illustrated implementation, this structure includes induction coils 130 positioned to surround at least a portion of each filament 117 and the silicon rod 114 to be grown thereon. In inductive heating, the induction coils 130 generate oscillating magnetic fields that induce corresponding electric currents in the growing silicon rod 114 to heat it. As shown, the induction coils 130 are tubular and have an axially extending central passageway so that cooling fluids (such as water) can be circulated through the induction coils to prevent them from overheating and releasing contaminant atoms inside the reactor.

In a specific implementation as shown in FIG. 6, a portion of the induction coil adjacent the filament 117/silicon rod 114 is shaped as a helix that surrounds and extends upwardly around the filament 117/silicon rod 114. More even heating is achieved if a helical portion of the induction coils 130 and the filament 117/silicon rod 114 are substantially coaxial, as shown. The efficiency of the inductive heating process increases as the separation between the coils 130 and the outer skin of the rod decreases.

In the specific implementation, each induction coil 130 is sized such that the coil is at least 100 mm away from the filament 117 prior to the start of chemical vapor deposition. This can be accomplished by the use of a coil having a helical portion, with the cylinder defined by inner diameter of the helical portion being spaced from the outer surface of the filament 117 by a distance D of from about 100 mm to about 200 mm.

One suitable material for the induction coils 130 is copper tubing. The tubing is sized depending upon the frequency at which the current is to be supplied through the filament 117/silicon rod 114. As the frequency of the current being supplied through the surface of the tubing increases, the surface area of the tubing must be increased.

For example, copper tubing used for the induction coil 130 may range in outside diameter from, e.g., 38 mm (with a wall thickness of about 1.27 mm) for current frequencies of about 50 kHZ to 140 mm for current frequencies of 800 kHz and above.

It should be understood that the description of induction coils herein refers to one or more of the best embodiments for a particular use. The optimum size, shape and materials used for the tubing will vary depending on the nature of the reactor and the deposition process used. For example, other materials having sufficient electrical and thermal conductivity could also be used, including aluminum, silver, or gold, or copper-, aluminum-, silver-, or gold-plated tubing.

The tubing can be connected to a source of water (not shown) for cooling. In the specific implementation, cooling water enters through the cover 101 at an inlet portion 132 of each induction coil, travels upwardly and then travels downwardly and out through the cover 101 through an outlet portion 134. In the case of induction coils made of copper, providing cooling water to control their temperature may help prevent the formation of undesirable copper silicides.

A high frequency power supply 140, which may be the same or different than the high frequency power supply 121, is connected to each induction coil 130 such that a high frequency AC current can be provided in the wall of the tubing. The power supply 140 can consist of a RF generator. The RF generator would have a power supply and a RF oscillator that feeds the high frequency coil. The power source could employ either solid state or vacuum tube technology, of a combination of both. The high frequency power supply 140 can be used alone, or can be used in combination with the high frequency power supply 121, to establish high frequency current in the outer skin portion of a growing silicon rod 114.

Operation of the reactor of FIG. 6 is similar to that of the reactor of FIG. 1. Billets 117 are placed inside of reactor and heated to a desired starting temperature. This can be done by activating the low frequency power supply 120 to establish a current in the filaments 117 (or by some other preheating method). The filaments 117 typically are preheated to a temperature of at least 200° C., to increase their conductivity. After the filaments 117 are initially heated, their resistance decreases, and the voltage applied to the filaments can be decreased. And when the surface temperature of the filaments 117 is sufficient, silicon-bearing gas is fed to the chamber to commence rod growth by chemical vapor deposition. After a predetermined amount of rod growth is achieved, high frequency current can be supplied either directly to the growing rods 114 from the high frequency power supply 121, by induction from the high frequency power supply 140, or by a combination thereof. To provide a desired result, the silicon deposition surface temperature should be in the range from 600° C. to 1200° C. at the surface of each growing rod 114.

Inductive heating may be used alone or in combination with other heating processes at various points during the operation of the reactor. As one example, inductive heating may be used during the chemical vapor deposition phase. Inductive heating may be used when the growing rod becomes less than a predetermined distance from the source of the induction field (e.g. the coils 130). Inductive heating may also be used a final annealing phase for fully grown rods. It might be possible to use an inductive heating technique for the initial heating of newly installed filaments, but this most likely would be inefficient due to the relatively large distance between an induction coil and its corresponding surrounded filament at the onset of heating.

It will be apparent that many changes may be made in the above-described embodiments. For example, other heat sources could be used with the reactor, particularly for the purpose of preheating filaments. Resistance heating is possible, and heat could be supplied by operation of a microwave or infrared heat source (not shown). Multiple heat sources can be operated, either sequentially or simultaneously, to maintain the desired temperature pattern within growing rods. Also, a high frequency power supply could be used advantageously for reactors where the precursor gas is a silicon-bearing gas other than monosilane. Such a power supply could be used with a trichlorosilane reactor of the type described in U.S. Pat. No. 4,724,160 of Arvidson et al. For the purpose of this disclosure, the term "silicon-bearing gas" is intended to mean any gas of the group consisting of silane (SiH$_4$), disilane (Si$_2$H$_6$), dichlorosilane (SiH$_2$Cl$_2$), trichlorosilane (SiHCl$_3$), silicon tetrachloride (SiCl$_4$), dibromosilane (SiH$_2$Br$_2$), tribromosilane (SiHBr$_3$), silicon tetrabromide (SiBr$_4$), diiodosilane (SiH$_2$I$_2$), triiodosilane (SiHI$_3$), silicon tetraiodide (SiI$_4$), and mixtures thereof. Therefore, the scope of the invention should be determined by the following claims.

What is claimed is:

1. A polycrystalline silicon rod wherein:
   the rod has a diameter greater than 150 mm; and
   the rod has a stress of no more than 11 MPa throughout the volume of the rod.

2. A polycrystalline silicone rod wherein:
   the rod has a diameter greater than 150 mm;
   the entire volume of the rod is at a temperature in the range of 600° C. to 1200° C.; and
   temperature variation throughout the entire volume of rod is no more than 50° C.

3. A polycrystalline silicon rod according to claim 2 wherein:
   the entire volume of the rod is at a temperature in the range of 600° C. to 1200° C.

* * * * *

UNITED STATES PATENT AND TRADEMARK OFFICE
CERTIFICATE OF CORRECTION

PATENT NO.        : 6,749,824 B2                                        Page 1 of 1
APPLICATION NO.   : 10/367365
DATED             : June 15, 2004
INVENTOR(S)       : David W. Keck, Ronald O. Russell and Howard Dawson It is certified that error appears in the above-identified patent and that said Letters Patent is hereby corrected as shown below:

On the title page item (75), delete:

"Howard J. Dawson, Anacortes, WA (US)"

Signed and Sealed this

Third Day of June, 2008

JON W. DUDAS
*Director of the United States Patent and Trademark Office*